(12) United States Patent
Lee

(10) Patent No.: US 12,028,082 B2
(45) Date of Patent: Jul. 2, 2024

(54) PHASE-LOCKED LOOP CIRCUIT AND OPERATION METHOD THEREOF

(71) Applicant: ELECTRONICS AND TELECOMMUNICATIONS RESEARCH INSTITUTE, Daejeon (KR)

(72) Inventor: Ja Yol Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 17/966,463

(22) Filed: Oct. 14, 2022

(65) Prior Publication Data

US 2023/0119518 A1   Apr. 20, 2023

(30) Foreign Application Priority Data

Oct. 18, 2021   (KR) .......................... 10-2021-0138191

(51) Int. Cl.
*H03L 7/099* (2006.01)
*H03L 7/081* (2006.01)
*H03L 7/091* (2006.01)

(52) U.S. Cl.
CPC ............ *H03L 7/0993* (2013.01); *H03L 7/081* (2013.01); *H03L 7/091* (2013.01)

(58) Field of Classification Search
CPC ... H03L 7/06; H03L 7/08; H03L 7/085; H03L 7/091; H03L 7/093
See application file for complete search history.

(56) References Cited

U.S. PATENT DOCUMENTS 7,737,743 B1   6/2010   Gao et al.
8,115,525 B2   2/2012   Min et al.
(Continued)

FOREIGN PATENT DOCUMENTS

KR   10-2011-0088901 A   8/2011
WO   2021164881 A1   8/2021

OTHER PUBLICATIONS

Jingcheng Tao et al., "A 2.2-GHz 3.2-mW DTC-Free Sampling ΔΣ Fractional-N PLL With -110-dBc/Hz in-Band Phase Noise and -246-dB FoM and -83-dBc Reference Spur", IEEE Transactions on Circuits and Systems-I: Regular Papers, vol. 66, No. 9, pp. 3317-3329, Sep. 2019.

(Continued)

*Primary Examiner* — Diana J. Cheng
(74) *Attorney, Agent, or Firm* — Rabin & Berdo, P.C.

(57) ABSTRACT

A phase-locked loop circuit includes a voltage controlled oscillator (VCO) that generates a VCO clock in response to a voltage control signal, a divider that divides the VCO clock to output a division clock, a phase-frequency error detector that receives a reference clock and outputs a first error compensation signal, a sampler that receives the reference clock and oversamples the reference clock at a rising edge or a falling edge to output a sampling clock, a window phase error detector that receives the reference clock and outputs a second error compensation signal, a residue phase error detector that outputs a third error compensation signal, an adder that accumulates the first error compensation signal, the second error compensation signal, and the third error compensation signal to output a final error compensation signal, and a loop filter that converts and output the final error compensation signal into the voltage control signal.

19 Claims, 6 Drawing Sheets

(56) References Cited

U.S. PATENT DOCUMENTS

| | | |
|---|---|---|
| 8,344,772 B2 | 1/2013 | Lee et al. |
| 8,432,199 B2 | 4/2013 | Lee et al. |
| 8,816,735 B1 * | 8/2014 | Chen ...................... H03L 7/085 |
| | | 327/158 |
| 9,490,819 B2 | 11/2016 | Chen et al. |
| 2011/0188551 A1 | 8/2011 | Shin et al. |
| 2012/0161832 A1 | 6/2012 | Lee et al. |
| 2023/0074921 A1 * | 3/2023 | Sjöland ................ H03L 7/1972 |

OTHER PUBLICATIONS

Ping-Ying Wang et al., "A Digital Intensive Fractional-N PLL and All-Digital Self-Calibration Schemes", IEEE Journal of Solid-State Circuits, vol. 44, No. 8, pp. 2182-2192, Aug. 2009.

Wanghua Wu et al., "A 28-nm 75-fsrms Analog Fractional-N Sampling PLL With a Highly Linear DTC Incorporating Background DTC Gain Calibration and Reference Clock Duty Cycle Correction", IEEE Journal of Solid-State Circuits, vol. 54, No. 5, pp. 1254-1265, May 2019.

Wei-Sung Chang et al., "A Fractional-N Divider-Less Phase-Locked Loop With a Subsampling Phase Detector", IEEE Journal of Solid-State Circuits, vol. 49, No. 12, pp. 2964-2975, Dec. 2014.

* cited by examiner

PHASE-LOCKED LOOP CIRCUIT AND OPERATION METHOD THEREOF

CROSS-REFERENCE TO RELATED APPLICATIONS

This application claims priority under 35 U.S.C. § 119 to Korean Patent Application No. 10-2021-0138191 filed on Oct. 18, 2021, in the Korean Intellectual Property Office, the disclosures of which are incorporated by reference herein in their entireties.

BACKGROUND

Embodiments of the present disclosure described herein relate to a phase-locked loop circuit and an operation method thereof, and more particularly, relate to a phase-locked loop circuit for locking a phase of an output clock via oversampling and an operation method thereof.

Recently, in implementing a radio frequency (RF) frequency synthesizer for mobile communication, a charge pump phase-locked loop (PLL) has been used mainly. However, an analog circuit design technology is integrated into the charge pump PLL, and a separate additional analog RF library is required other than a design library provided in a standard digital CMOS process due to an analog circuit and an analog signal characteristic.

Because it is difficult for the charge pump PLL to be integrated together with a digital baseband signal processing block which uses a digital CMOS process, recently, a digital RF PLL has been researched and developed. However, there is a limitation in reducing in-band noise and fractional spur due to digital quantization noise.

Because noise of a PLL frequency synthesizer has a direct influence on communication quality of wired and wireless communication, research continues to be conducted in academia and industry to continuously improve noise. Recently, in an attempt to reduce PLL in-band noise, research results on an injection-locking PLL or a subsampling PLL have been published in papers or patents.

The present disclosure proposes a structure for improving in-band noise of the charge pump PLL using an oversampling scheme.

SUMMARY

Embodiments of the present disclosure provide a phase-locked loop circuit for detecting a phase error of a fractional phase-locked loop via oversampling and locking a phase of an output clock and an operation method thereof.

According to an embodiment, a phase-locked loop circuit may include a voltage controlled oscillator (VCO) configured to generate a VCO clock of any frequency in response to a voltage control signal, a divider configured to divide the VCO clock based on a dividing ratio to output a division clock, a phase-frequency error detector configured to receive a reference clock and output a first error compensation signal based on the reference clock and the division clock, a sampler configured to receive the reference clock and oversample the reference clock at a rising edge or a falling edge of the VCO clock to output a sampling clock, a window phase error detector configured to receive the reference clock and output a second error compensation signal based on the reference clock and the sampling clock, a residue phase error detector configured to output a third error compensation signal based on the VCO clock and the sampling clock, an adder configured to accumulate the first error compensation signal, the second error compensation signal, and the third error compensation signal to output a final error compensation signal, and a loop filter configured to convert and output the final error compensation signal into the voltage control signal.

The phase-frequency error detector may detect a first phase difference between the reference clock and the division clock and may output the first error compensation signal corresponding to the first phase difference. The first error compensation signal may be a current signal.

The current signal may be non-linearly proportional in magnitude to the first phase difference.

the sampling clock may include edge information of the VCO clock and frequency information of the reference clock.

The sampler may compare phases of the reference clock and the VCO clock and may further output an early signal or a late signal depending on an order of the phases of the reference clock and the VCO clock.

The residue phase error detector may consider the early signal or the late signal while detecting a phase difference between the VCO clock and the sampling clock.

The window phase error detector may detect a second phase difference between the reference clock and the sampling clock and may output the second error compensation signal corresponding to the second phase difference. The second error compensation signal may be a current signal.

The current signal may be non-linearly proportional in magnitude to the second phase difference.

The phase-locked loop circuit may further include a delay loop circuit. The delay loop circuit may multiply a reference frequency signal by N times via edge coupling to generate the reference clock.

The phase-locked loop circuit may further include a modulator configured to accumulate a frequency command word to calculate a fractional division ratio. The divider may divide the VCO clock at the fractional division ratio to output the division clock.

According to an embodiment, an operation method of a phase-locked loop circuit may include receiving a reference clock, generating a voltage controlled oscillator (VCO) clock in response to a voltage control signal, dividing the VCO clock based on a dividing ratio to output a division clock, oversampling the reference clock at a rising edge or a falling edge of the VCO clock to output a sampling clock, generating error compensation signals based on the reference clock, the VCO clock, the division clock, and the sampling clock, generating the voltage control signal based on the error compensation signals, and generating an output clock in response to the voltage control signal.

The generating of the division clock may include accumulating a frequency command word to calculate a fractional division ratio and dividing the VCO clock at the fractional division ratio.

The sampling clock may include edge information of the VCO clock and frequency information of the reference clock.

The generating of the error compensation signals may include comparing first phase differences between the reference clock and the division clock to generate a first error compensation signal, comparing second phase differences between the reference clock and the sampling clock to generate a second error compensation signal, and comparing third phase differences between the sampling clock and the VCO clock to generate a third error compensation signal.

The generating of the third error compensation signal may include comparing phases of the reference clock and the VCO clock, outputting an early signal or a late signal in an order of the phases of the reference clock and the VCO clock, and generating the third error compensation signal with regard to the early signal or the late signal based on the third phase difference.

The first error compensation signal, the second error compensation signal, and the third error compensation signal may be current signals.

A first current signal corresponding to the first error compensation signal may be non-linearly proportional in magnitude to the first phase difference.

A second current signal corresponding to the second error compensation signal may be non-linearly proportional in magnitude to the second phase difference.

The generating of the voltage control signal may include adding the first error compensation signal, the second error compensation signal, and the third error compensation signal to generate a final error compensation signal, converting the final error compensation signal into the voltage control signal, and removing a high frequency component of the voltage control signal.

The generating of the first error compensation signal may be more activated when the first phase difference is greater than a reference value. The generating of the second error compensation signal may be more activated when the second phase difference is less than or equal to the reference value.

The first phase difference may be the same as the second phase difference or may have a difference of a setting value or less.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described clearly and in detail to such an extent that those skilled in the art easily carry out the present disclosure. Herein, because the present disclosure is able to be implemented in several different forms, embodiments described below are merely illustrative irrespective of whether it is expressed. In other words, the present disclosure may not to be limited to embodiments disclosed below and may be implemented in various different forms.

Figure 1:
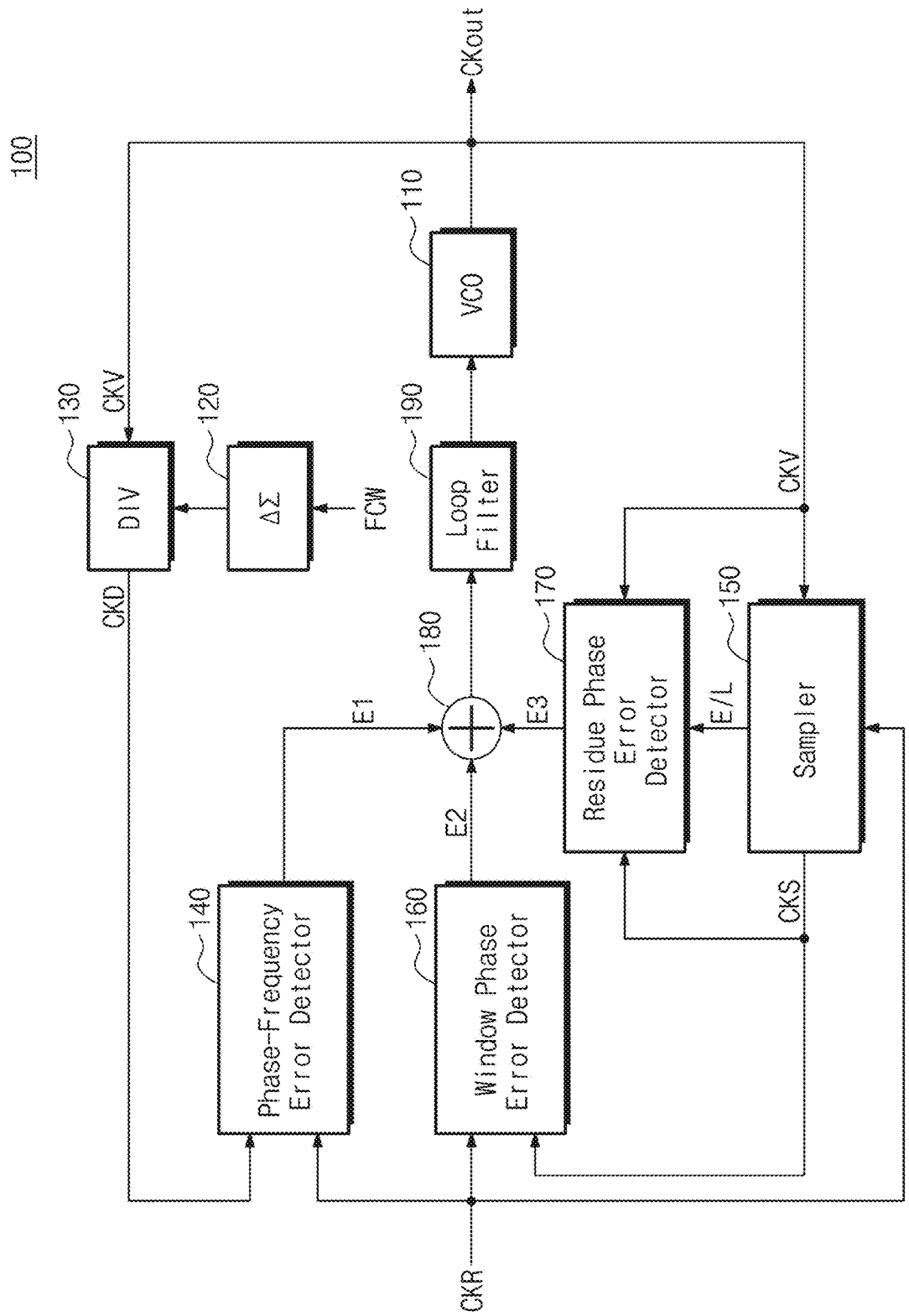
FIG. 1 is a block diagram of a phase-locked loop circuit according to an embodiment of the present disclosure.

FIG. 1 is a block diagram of a phase-locked loop circuit according to an embodiment of the present disclosure. Referring to FIG. 1, a phase-locked loop circuit 100 may include a voltage controlled oscillator (VCO) 110, a modulator 120, a divider 130, a phase-frequency error detector 140, a sampler 150, a window phase error detector 160, a residue phase error detector 170, an adder 180, and a loop filter 190.

The phase-locked loop circuit 100 may control a phase of a VCO clock CKV depending on a phase of a reference clock CKR and may output an output clock CKout of a locked phase. In the specification, the output clock CKout is used as the same meaning as the VCO clock CKV which is an output of the VOC 110. For example, the phase-locked loop circuit 100 may compensate for a phase difference between the VCO clock CKV and the reference clock CKR to uniformly lock an average frequency of the output clock CKout.

When the phase difference between the reference clock CKR and the VCO clock CKV is greater than a reference value, the phase-locked loop circuit 100 may operate in a first mode. The first mode may be referred to as a frequency-locked mode. The phase-locked loop circuit 100 may quickly compensate for a phase error by comparing a division clock CKD and the reference clock CKR in the first mode. The division clock CKD may be a clock in which the VCO clock CKV is divided.

When the phase difference between the reference clock CKR and the VCO clock CKV is less than or equal to the reference value, the phase-locked loop circuit 100 may operate in a second mode. The second mode may be referred to as a phase-locked mode. The phase-locked loop circuit 100 may efficiently compensate for a phase error by comparing a sampling clock CKS and the reference clock CKR in the second mode. The sampling clock CKS may be a clock in which the reference clock CKR is oversampled with respect to the VCO clock CKV.

The phase-frequency error detector 140 may play a major role in phase locking in the first mode. The window phase error detector 160 may play a major role in phase locking in the second mode. Operations of the other components of the phase-locked loop circuit 100, for example, the VCO 110, the modulator 120, the divider 130, the phase-frequency error detector 140, the sampler 150, the window phase error detector 160, the residue phase error detector 170, the adder 180, and the loop filter 190 may be similar to each other in the first mode and the second mode. Therefore, in the specification below, the operations of the respective components of the phase-locked loop circuit 100 will be described without a division between the first mode and the second mode.

The VCO 110 may generate the VCO clock CKV of any frequency in response to a voltage control signal. The voltage control signal may be received from the loop filter 190. The VCO clock CKV may have a frequency corresponding to the voltage control signal. The VCO clock CKV may be output as the output clock CKout. The VCO 110 may deliver the VCO clock CKV to the divider 130 and the sampler 150 through a buffer (not shown).

The modulator 120 may accumulate a frequency command word FCW and may output the accumulated value to the divider 130. For example, the modulator 120 may be a sigma-delta modulator, and the accumulated value may be a decimal value. In this case, the sigma-delta modulator may generate and deliver a fractional division ratio to the divider 130.

The divider 130 may divide the VCO clock CKV at a dividing ratio to output the division clock CKD. For example, the dividing ratio may be a fractional division ratio. The divider 130 may divide the VCO block CKV received from the VCO 110, based on the fractional division ratio generated according to the frequency command word FCW, to generate the division clock CKD. The divider 130 may transmit the division clock CKD to the phase-frequency error detector 140.

The phase-frequency error detector 140 may detect a frequency and phase difference between the reference clock CKR and the division clock CKD. The phase-frequency error detector 140 may output a first error compensation signal E1 corresponding to the phase difference between the reference clock CKR and the division clock CKD. For example, the first error compensation signal E1 may be a current signal. The magnitude of current according to the current signal may increase linearly or non-linearly depending on the phase difference between the reference clock CKR and the division clock CKD. A detailed description thereof will be described below with reference to FIG. 3.

The sampler 150 may oversample the reference clock CKR with respect to the VCO clock CKV to output the sampling clock CKS. In detail, the sampler 150 may oversample the reference clock CKR to output the sampling clock CKS synchronized with a rising edge or a falling edge of the VCO clock CKV. As a result, the sampling clock CKS may include edge information of the VCO clock CKV and may include frequency information of the reference clock CKR. For example, when the VCO clock CKV is a frequency of 1 GHz and when the reference clock CKR is a frequency of 50 MHz, the sampling clock CKS may have a frequency of about 50 MHz while having a phase of the VCO clock CKV. The sampler 150 may transmit the sampling clock CKS to the window phase error detector 160 and the residue phase error detector 170.

The sampler 150 may compare the reference clock CKR and the VCO clock CKV to output an early signal E or a late signal L. For example, the sampler 150 may output the early signal E, when the reference clock CKR is earlier in phase than the VCO clock CKV, and may output the late signal L, when the reference clock CKR is later in phase than the VCO clock CKV. The sampler 150 may transmit the early signal E or the late signal L to the residue phase error detector 170.

The window phase error detector 160 may detect a phase difference between the reference clock CKR and the sampling clock CKS. The window phase error detector 160 may output a second error compensation signal E2 corresponding to the phase difference between the reference clock CKR and the sampling clock CKS. For example, the second error compensation signal E2 may be a current signal. The magnitude of current according to the current signal may increase linearly or non-linearly depending on the phase difference between the reference clock CKR and the sampling clock CKS. A detailed description thereof will be described below with reference to FIG. 4.

The window phase error detector 160 may directly compare the VCO clock CKV with the reference clock CKR via oversampling without dividing the VCO clock CKV. Because the sampling clock CKS corresponds to a phase of the VCO clock CKV, the phase difference between the reference clock CKR and the sampling clock CKS may correspond to the phase difference between the reference clock CKR and the VCO clock CKV. However, a fine phase error between the VCO clock CKV and the sampling clock CKS may occur in the oversampling process.

The residue phase error detector 170 may compensate for the fine phase error between the VCO clock CKV and the sampling clock CKS. The residue phase error detector 170 may detect a phase difference between the VCO clock CKV and the sampling clock CKS and may output a third error compensation signal E3 corresponding to the phase difference between the VCO clock CKV and the sampling clock CKS. For example, the third error compensation signal E3 may be a current signal. At this time, the residue phase error detector 170 may consider the early signal E and the late signal L received from the sampler 150.

The adder 180 may add the error compensation signals output from the phase-frequency error detector 140, the window phase error detector 160, and the residue phase error detector 170 to generate a final error compensation signal. The final error compensation signal may be a current signal as the sum of the first error compensation signal E1, the second error compensation signal E2, and the third error compensation signal E3. The adder 180 may deliver the final error compensation signal to the loop filter 190.

The loop filter 190 may convert the final error compensation signal output from the adder 180 into the voltage control signal. According an embodiment, the loop filter 190 may operate as a low pass filter which filters the final error compensation signal to remove a high frequency component. For example, the loop filter 190 may be composed of at least one capacitor and at least one resistor. However, the present disclosure is not limited thereto. The loop filter 190 may be implemented with various components capable of operating as a low pass filter.

Figure 2A:
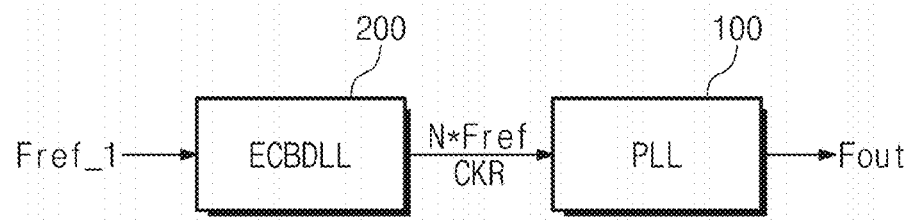
FIGS. 2A and 2B illustrate an example of a reference clock of FIG. 1.
Figure 2B:
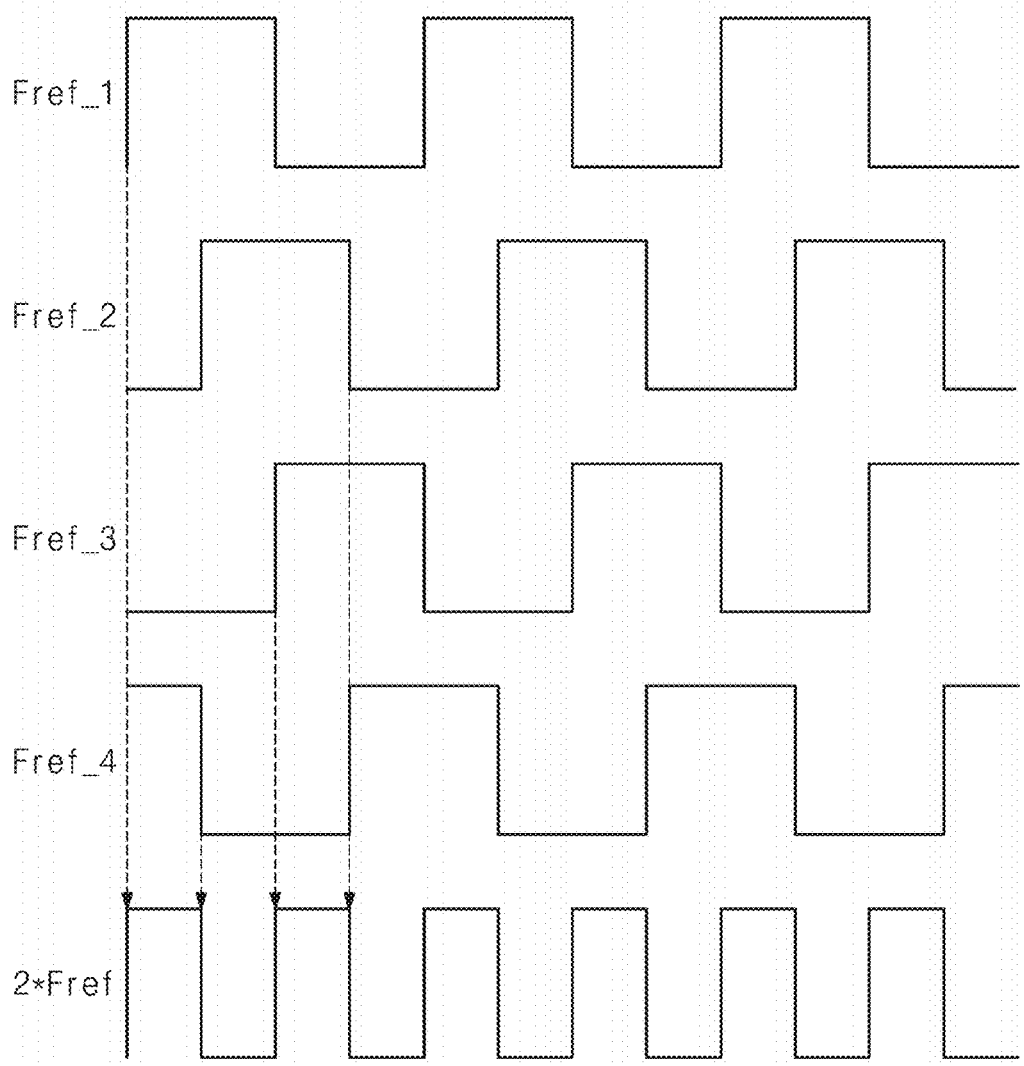

FIGS. 2A and 2B illustrate an example of a reference clock of FIG. 1. FIG. 2A illustrates an edge-combined delay-locked loop (ECBDLL) 200 for outputting a reference clock CKR, and FIG. 2B illustrates an operation process of the ECBDLL 200.

Referring to FIGS. 1, 2A, and 2B, a phase-locked loop circuit (PLL) 100 may receive the reference clock CKR from the ECBDLL 200. The reference clock CKR may have a frequency (N*Fref) in which a reference frequency Fref is multiplied by N times. The PLL 100 may output an output frequency Fout synchronized with the reference clock CKR. Because the detailed description of the PLL 100 is given in FIG. 1, it will be omitted.

The ECBDLL 200 may receive a reference frequency signal Fref_1 of the reference frequency Fref from a crystal oscillator. The ECBDLL 200 may delay the reference frequency signal Fref_1 and may output the reference clock CKR of the frequency (N*Fref) in which the reference frequency Fref is multiplied by N times based on the delayed signals. As such, the ECBDLL 200 may reduce in-band noise as the crystal oscillator directly generates the reference clock CKR of a high frequency.

For example, the ECBDLL 200 may delay the reference frequency signal Fref_1 by a ¼ period to generate delayed signals Fref_2, Fref_3, and Fref_4. The second frequency signal Fref_2 may be a signal delayed by a ¼ period from the reference frequency signal Fref_1. The third frequency signal Fref_3 may be a signal delayed by a 2/4 period from the reference frequency signal Fref_1. The fourth frequency signal Fref_4 may be a signal delayed by a ¾ period from the reference frequency signal Fref_1.

The ECBDLL 200 may output the reference clock CKR of the frequency (N*Fref) in which the reference frequency Fref is multiplied by N times, with respect to timings corresponding to a rising edge or a falling edge of each of the delayed signals Fref_2, Fref_3, and Fref_4. For example, the reference clock CKR may be synchronized with the rising edge of the reference frequency signal Fref_1, the falling edge of the second frequency signal Fref_2, the rising edge of the third frequency signal Fref_3, and the falling edge of the fourth frequency signal Fref_4. As a result, the frequency of the reference clock CKR may be two times the reference frequency Fref of the reference frequency signal Fref_1.

Figure 3:
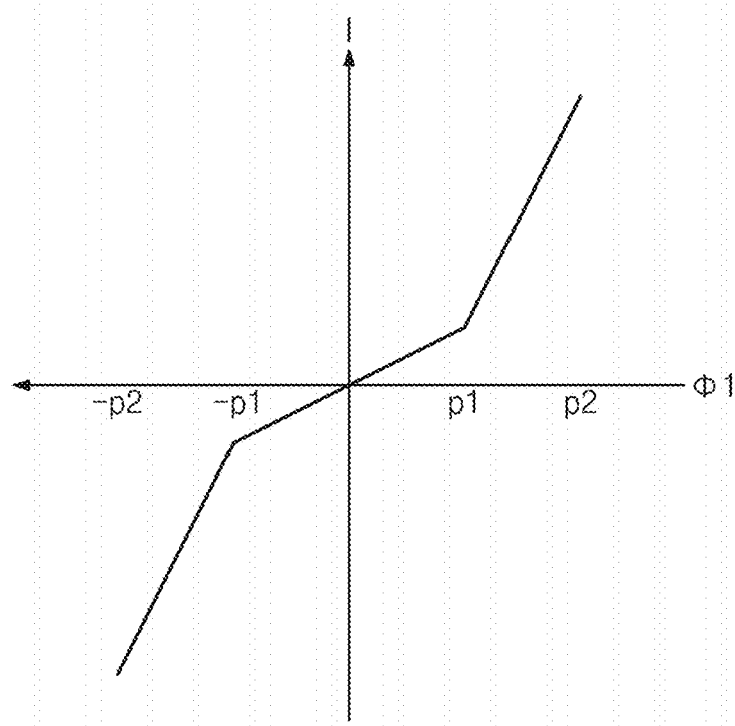
FIG. 3 is a graph illustrating an output characteristic of a phase-frequency error detector of FIG. 1.

FIG. 3 is a graph illustrating an output characteristic of a phase-frequency error detector of FIG. 1. The x-axis of FIG. 3 indicates a phase difference $\Phi1$ between a reference clock CKR and a division clock CKD, and the y-axis of FIG. 3 indicates current I. Referring to FIGS. 1 and 3, a phase-frequency error detector 140 may have a linear or non-linear output characteristic.

The phase-frequency error detector 140 may detect the phase difference $\Phi1$ between the reference clock CKR and the division clock CKD. The phase-frequency error detector 140 may output current I according to the phase difference $\Phi1$ between the reference clock CKR and the division clock CKD. The magnitude of the current I may be proportional to the phase difference $\Phi1$ between the reference clock CKR and the division clock CKD, but may have a linear characteristic or a non-linear characteristic.

A slope between the phase difference $\Phi1$ and the current I may be larger when the phase difference $\Phi1$ between the reference clock CKR and the division clock CKD is in a second range of p1 to p2 or −p2 to −p1 than when the phase difference $\Phi1$ between the reference clock CKR and the division clock CKD is in a first range of −p1 to p1. A slope when the phase difference $\Phi1$ between the reference clock CKR and the division clock CKD is in the first range of −p1 to p1 may be less than a reference value. For example, the slope between the phase difference $\Phi1$ and the current I may be close to "0". In other words, the influence of the phase-frequency error detector 140 may decrease, when the phase difference $\Phi1$ between the reference clock CKR and the division clock CKD is in the first range of −p1 to p1. Thus, the influence of a window phase error detector 160 may increase.

Meanwhile, a slope when the phase difference $\Phi1$ between the reference clock CKR and the division clock CKD is in the second range of p1 to p2 or −p2 to −p1 may be greater than the reference value. In other words, the influence of the phase-frequency error detector 140 may increase, when the phase difference $\Phi1$ between the reference clock CKR and the division clock CKD is in the second range of p1 to p2 or −p2 to −p1. Thus, the influence of a window phase error detector 160 may decrease.

Figure 4:
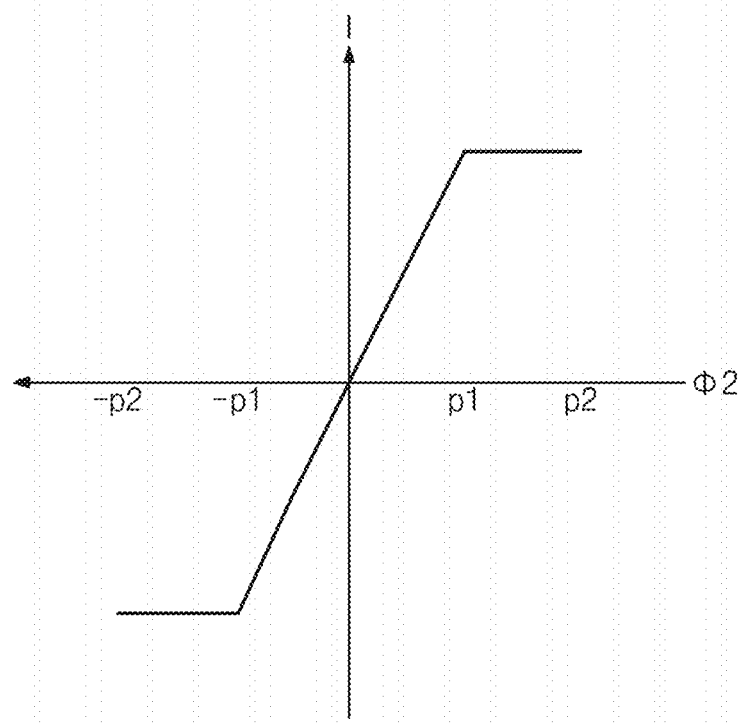
FIG. 4 is a graph illustrating an output characteristic of a window phase error detector of FIG. 1.

FIG. 4 is a graph illustrating an output characteristic of a window phase error detector 160 of FIG. 1. The x-axis of FIG. 4 indicates a phase difference $\Phi2$ between a reference clock CKR and a sampling clock CKS, and the y-axis of FIG. 4 indicates current I. Referring to FIGS. 1 and 4, the window phase error detector 160 may have a linear or non-linear output characteristic.

The window phase error detector 160 may detect the phase difference $\Phi2$ between the reference clock CKR and the sampling clock CKS. The window phase error detector 160 may output current I according to the phase difference $\Phi2$ between the reference clock CKR and the sampling clock CKS. The magnitude of the current I may be proportional to the phase difference $\Phi2$ between the reference clock CKR and the sampling clock CKS, but may have a linear characteristic or a non-linear characteristic.

A slope between the phase difference $\Phi2$ and the current I may be larger when the phase difference $\Phi2$ between the reference clock CKR and the sampling clock CKS is in a first range of −p1 to p1 than when the phase difference $\Phi2$ between the reference clock CKR and the sampling clock CKS is in a second range of p1 to p2 or −p2 to −p1. A slope when the phase difference $\Phi2$ between the reference clock CKR and the sampling clock CKS is in the first range of −p1 to p1 may be greater than a reference value. In other words, the influence of the window phase error detector 160 may increase, when the phase difference $\Phi2$ between the reference clock CKR and the sampling clock CKS is in the first range of −p1 to p1. Thus, the influence of a phase-frequency error detector 140 may decrease.

Meanwhile, a slope when the phase difference $\Phi2$ between the reference clock CKR and the sampling clock CKS is in the second range of p1 to p2 or −p2 to −p1 may be less than the reference value. For example, the slope between the phase difference $\Phi2$ and the current I may be close to "0". In other words, the influence of the window phase error detector 160 may decrease, when the phase difference $\Phi2$ between the reference clock CKR and the sampling clock CKS is in the second range of p1 to p2 or −p2 to −p1. Thus, the influence of the phase-frequency error detector 140 may increase.

Combining FIGS. 3 and 4, a phase-locked loop circuit 100 may adjust sensitivity of error detection based on the phase difference $\Phi1$ between the reference clock CKR and the division clock CKD or the phase difference $\Phi2$ between the reference clock CKR and the sampling clock CKS. The division clock CKD and the sampling clock CKS may be clocks derived from a VCO clock CKV. The phase difference $\Phi1$ between the reference clock CKR and the division clock CKD and the phase difference $\Phi2$ between the reference clock CKR and the sampling clock CKS may be the same as each other or may have a difference within a setting value. The phase-locked loop circuit 100 may increase the influence of the window phase error detector 160 with high sensitivity when the phase difference $\Phi2$ between the reference clock CKR and the sampling clock CKS is in the first range of −p1 to p1. Furthermore, the phase-locked loop circuit 100 may increase the influence of the phase-frequency error detector 140 with low sensitivity, when the phase difference $\Phi1$ between the reference clock CKR and the division clock CKD is in the second range of p1 to p2 or −p2 to −p1, thus optimizing the efficiency of phase error detection.

Figure 5:
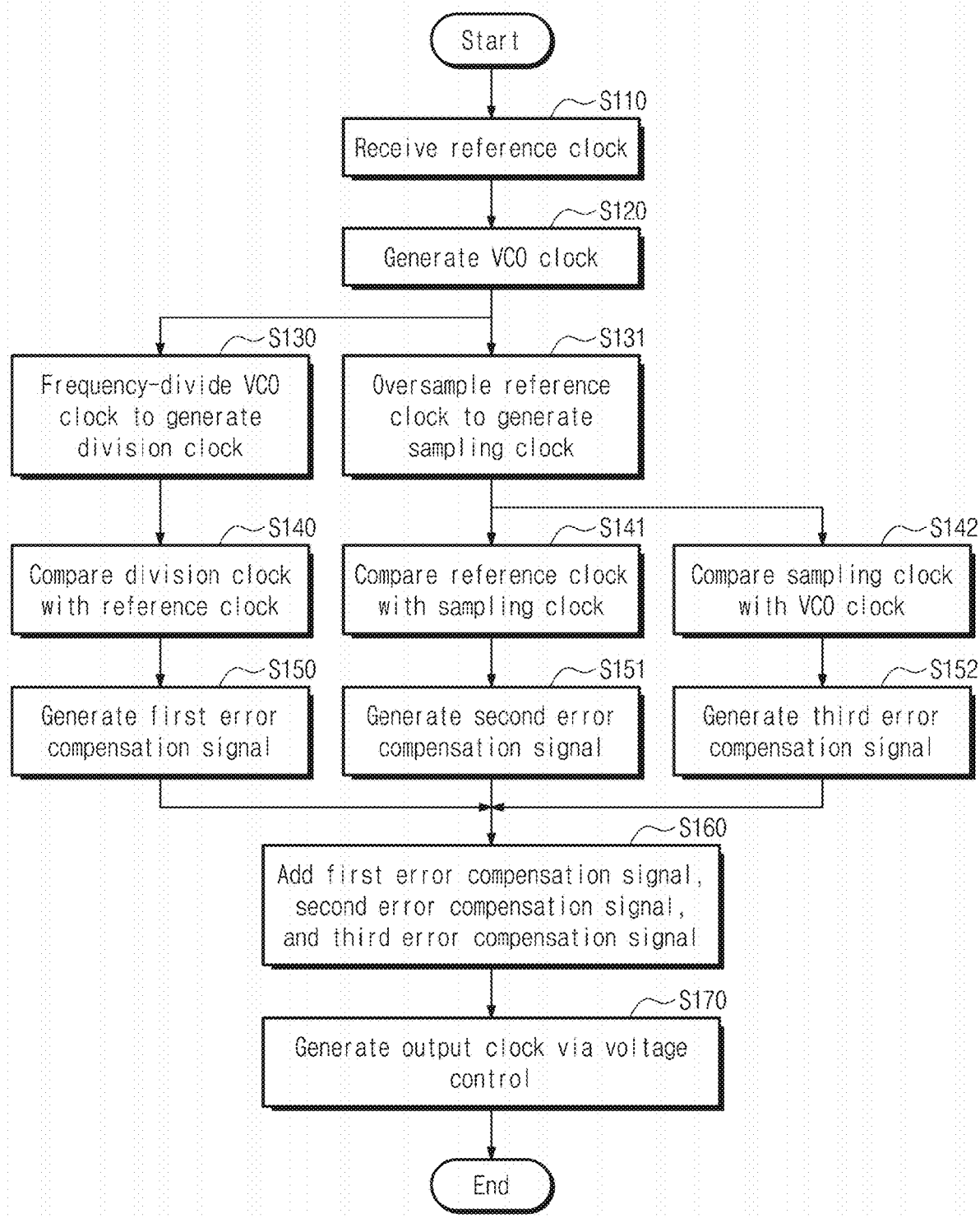
FIG. 5 is a flowchart illustrating an operation method of a phase-locked loop circuit according to an embodiment of the present disclosure.

FIG. 5 is a flowchart illustrating an operation method of a phase-locked loop circuit according to an embodiment of the present disclosure. Referring to FIGS. 1 and 5, a phase-locked loop circuit 100 may output an output clock CKout synchronized with a phase of a reference clock CKR.

In operation S110, the phase-locked loop circuit 100 may receive the reference clock CKR. The reference clock CKR may be a signal generated by a crystal oscillator. For example, a phase-frequency error detector 140, a window phase error detector 160, a sampler 150 may receive the reference clock CKR. According an embodiment, the reference clock CKR may be a signal in which a reference frequency is multiplied by N times by an ECBDLL 200 as shown in FIG. 2A.

In operation S120, the phase-locked loop circuit 100 may generate a VCO clock CKV. For example, the VCO 110 may generate the VCO clock CKV in response to a voltage control signal received from a loop filter 190. The VCO clock CKV may be the same clock signal as an output clock CKout, which may be referred to as the VCO clock CKV when fed back in the phase-locked loop circuit 100 and may be referred to as the output clock CKout when output from the phase-locked loop circuit 100. The VCO clock CKV may be fed back to a divider 130 and the sampler 150.

In operation S130, the phase-locked loop circuit 100 may divide the VCO clock CKV to generate a division clock CKD. For example, the divider 130 may divide the VCO clock CKV at a dividing ratio to generate the division clock CKD. A modulator 120 may accumulate a frequency command word FCW to calculate the dividing ratio. According to an embodiment, the dividing ratio may be a fractional division ratio.

In operation S131, the phase-locked loop circuit 100 may sample a reference clock CKR with respect to the VCO clock CKV. For example, the sampler 150 may receive the reference clock CKR and the VCO clock CKV and may synchronize the reference clock CKR with an edge of the VCO clock CKV to oversample the reference clock CKR. In other words, the reference clock CKR may be lower in frequency than the VCO clock CKV. The sampling clock CKS in which the reference clock CKR is oversampled may have a frequency similar to the frequency of the reference clock CKR while including edge information of the VCO clock CKV.

In operation S140, the phase-locked loop circuit 100 may compare the division clock CKD with the reference clock CKR. For example, the phase-frequency error detector 140 may compare frequency and phase differences between the division clock CKD and the reference clock CKR. Detecting a phase difference via the division clock CKD may facilitate fast detection, but may increase error noise. Therefore, the phase-locked loop circuit 100 may use the phase-frequency error detector 140 as a main phase difference detection source in a first mode where the phase difference between the division clock CKD and the reference clock CKR is greater than a reference value. The phase-locked loop circuit 100 may quickly detect a phase difference in the first mode and may enter a second mode, when the phase difference between the division clock CKD and the reference clock CKR is less than or equal to the reference value.

In operation S141, the phase-locked loop circuit 100 may compare the reference clock CKR with a sampling clock CKS. For example, a window phase error detector 160 may compare phase differences between the reference clock CKR and the sampling clock CKS. The sampling clock CKS may be a clock having only phase information of the VCO clock CKV without division. Detecting the phase difference via the sampling clock CKS may reduce error noise. Therefore, the phase-locked loop circuit 100 may use the window phase error detector 160 as a main phase difference detection source in the second mode where the phase difference between the sampling clock CKS and the reference clock CKR is less than or equal to the reference value.

In operation S142, the phase-locked loop circuit 100 may compare the sampling clock CKS with the VCO clock CKV to detect a fine phase error. For example, a residue phase error detector 170 may compare phase differences between the sampling clock CKS and the VCO clock CKV. As the phase of the sampling clock CKS and the phase of the VCO clock CKV are unable to be physically completely identical to each other in the sampling process, the fine phase error may occur. The residue phase error detector 170 may detect such a fine phase error to reduce phase noise.

In operation S150, the delay locked loop 100 may generate a first error compensation signal E1. For example, the phase-frequency error detector 140 may generate the first error compensation signal E1 according to the phase difference between the reference clock CKR and the division clock CKD. According to an embodiment, the first error compensation signal E1 may be a current signal. The magnitude of current of the first error compensation signal E1 may be proportional to the phase difference between the reference clock CKR and the division clock CKD. However, as the phase difference between the reference clock CKR and the division clock CKD increases, the magnitude of current of the first error compensation signal E1 may not linearly increase.

In operation S151, the phase-locked loop circuit 100 may generate a second error compensation signal E2. For example, the window phase error detector 160 may generate a second error compensation signal E2 according to the phase difference between the reference clock CKR and the sampling clock CKS. According an embodiment, the second error compensation signal E2 may be a current signal. The magnitude of current of the second error compensation signal E2 may be proportional to the phase difference between the reference clock CKR and the sampling clock CKS. However, as the phase difference between the reference clock CKR and the sampling clock CKS increases, the magnitude of current of the second error compensation signal E2 may not linearly increase.

In operation S152, the phase-locked loop circuit 100 may generate a third error compensation signal E3. For example, the residue phase error detector 170 may generate the third error compensation signal E3 according to the phase difference between the sampling clock CKS and the VCO clock CKV. According an embodiment, the third error compensation signal E3 may be a current signal. At this time, the phase-locked loop circuit 100 may consider an early signal E or a late signal L in which the reference clock CKR and the VCO clock CKV are compared with each other.

Operation S150, operation S151, and operation S152 may proceed at the same time or at different times. However, whether operation S150 mainly operates or whether operations S151 and S152 mainly operate may vary depending on the phase difference between the reference clock CKR and the division clock CKD or the phase difference between the reference clock CKR and the sampling clock CKS.

In detail, operation S150 may be more activated than operations S151 and S152, when the phase difference between the reference clock CKR and the division clock CKD is greater than a reference value. Operation S151 may be more activated than operation S150, when the phase difference between the reference clock CKR and the sampling clock CKS is less than or equal to the reference value. The phase difference between the reference clock CKR and the division clock CKD may be the same as the phase difference between the reference clock CKR and the sampling clock CKS or may have a difference within a setting value with the phase difference between the reference clock CKR and the sampling clock CKS. As such, the phase-locked loop circuit 100 may efficiently detect a phase difference and may compensate for an error.

In operation S160, the phase-locked loop circuit 100 may add the first error compensation signal E1, the second error compensation signal E2, and the third error compensation signal E3. For example, the adder 180 may add the first error compensation signal E1, the second error compensation signal E2, and the third error compensation signal E3 to generate a final error compensation signal. According an embodiment, the final error compensation signal may be a current signal.

In operation S170, the phase-locked loop circuit 100 may generate an output clock CKout via voltage control. The phase-locked loop circuit 100 may convert the final error compensation signal into the voltage control signal. Furthermore, the phase-locked loop circuit 100 may filter the final error compensation signal to generate the voltage control signal in which a high frequency component is removed. The voltage control signal may control the VCO 110 to output the output clock CKout of a desired frequency.

Figure 6:
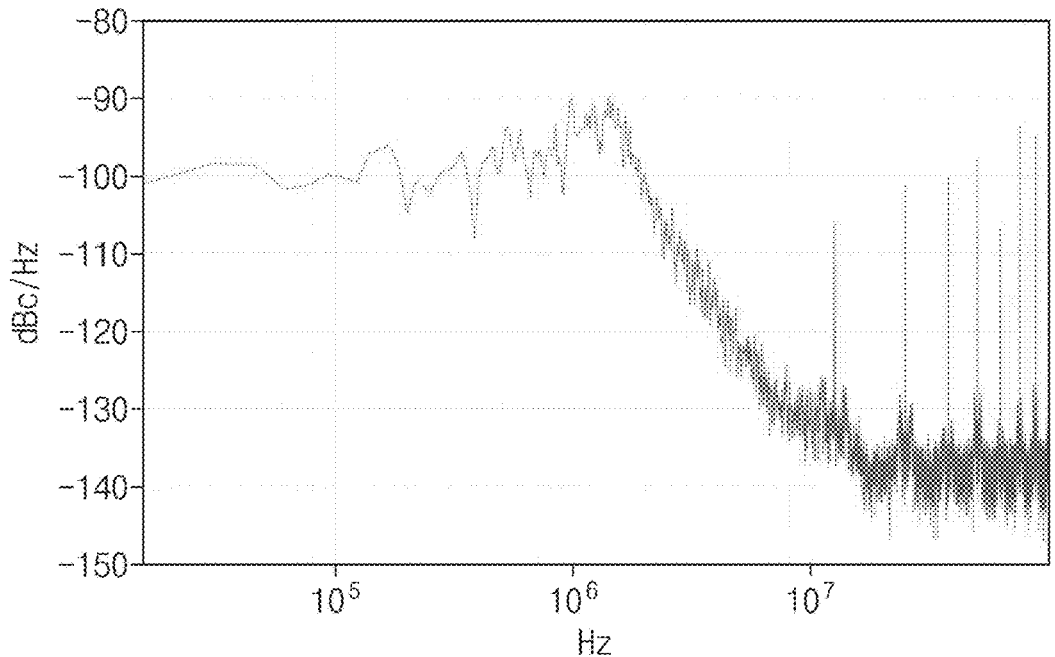
FIG. 6 is a drawing illustrating a VCO clock phase noise characteristic simulated when turning on a phase error compensation circuit of a phase-locked loop circuit according to an embodiment of the present disclosure.

FIG. 6 is a drawing illustrating a VCO clock phase noise characteristic simulated when turning on a phase error compensation circuit of a phase-locked loop circuit according to an embodiment of the present disclosure. Referring to FIG. 6, when a phase-locked loop circuit 100 operates, a phase error detector 160 and a residue phase error detector 170 may operate. In this case, in-band noise may be about −100 dBc/Hz in phase noise of a VCO output signal.

Figure 7:
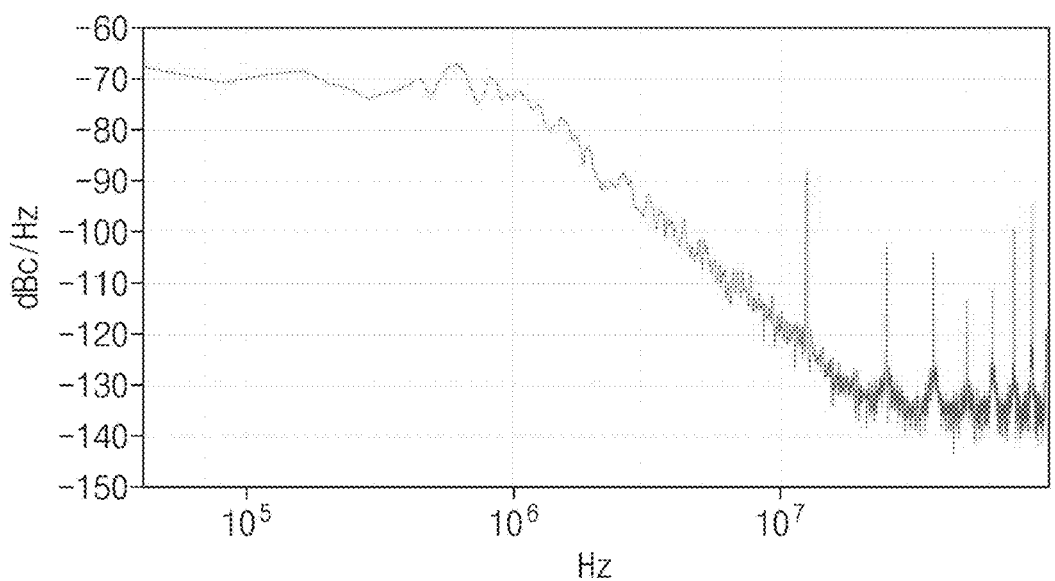
FIG. 7 is a drawing illustrating a VCO clock phase noise characteristic simulated when turning off a phase error compensation circuit of a phase-locked loop circuit according to an embodiment of the present disclosure.

FIG. 7 is a drawing illustrating a VCO clock phase noise characteristic simulated when turning off a phase error compensation circuit of a phase-locked loop circuit according to an embodiment of the present disclosure. Referring to FIG. 7, when a phase-locked loop circuit 100 does not operate, a phase error detector 160 and a residue phase error detector 170 may not operate. In this case, in-band noise may be about −70 dBc/Hz in phase noise of a VCO output signal.

Referring to FIGS. 6 and 7, when a frequency of a VCO clock is 19.851 GHz and when turning on the window phase error detector 160 and the residue phase error detector 170, it may be identified that in-band phase noise is improved by about 30 dB.

Figure 8:
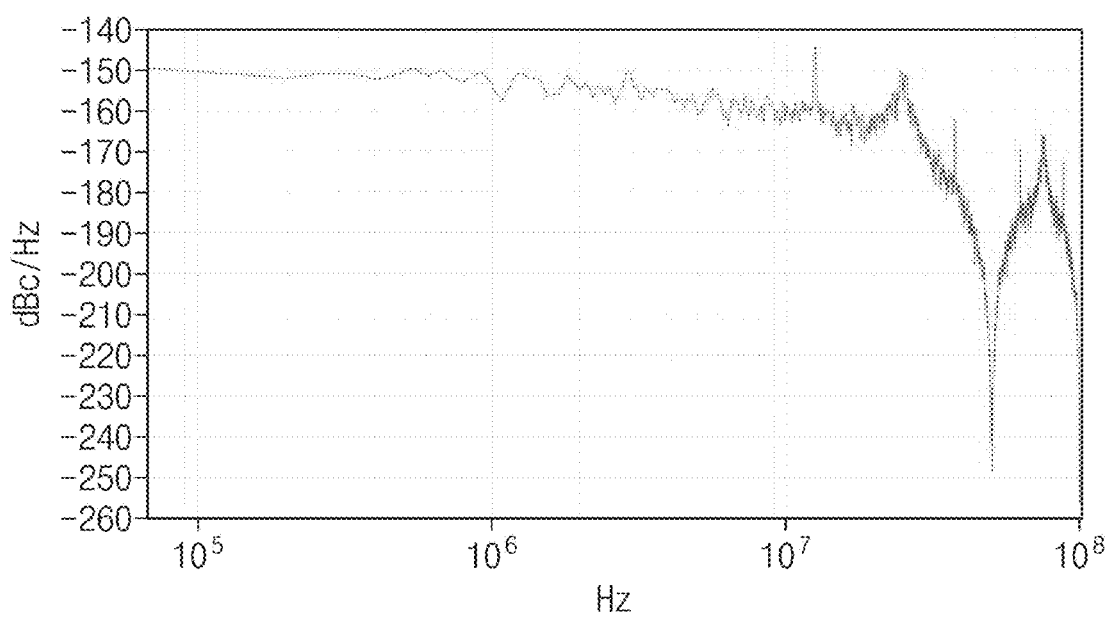
FIG. 8 is a drawing illustrating a simulated phase noise characteristic of a reference clock of a phase-locked loop circuit according to an embodiment of the present disclosure.

FIG. 8 is a drawing illustrating a simulated phase noise characteristic of a reference clock of a phase-locked loop circuit according to an embodiment of the present disclosure. Referring to FIG. 8, in-band noise may be about −150 dBc/Hz in phase noise of a reference clock CKR of a phase-locked loop circuit 100. In other words, it may be seen that phase noise of a VCO clock more increases by about 50 dB in FIG. 6 than the phase noise of the reference clock CKR and increases by about 80 dB in FIG. 7 than the phase noise of the reference clock CKR. Thus, the phase-locked loop circuit 100 according to an embodiment of the present disclosure may effectively suppress in-band phase noise.

According to the present disclosure, the phase-locked loop circuit directly compares phases of a sampling clock in which a VCO clock is oversampled and a reference clock, thus efficiently detecting a phase error and reducing phase noise via residue phase error detection.

The above-mentioned contents are detailed embodiments for executing the present disclosure. The present disclosure may include embodiments capable of being simply changed in design or being easily changed, as well as the above-mentioned embodiments. Furthermore, the present disclosure may also include technologies capable of being easily modified and executed using embodiments. While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A phase-locked loop circuit, comprising:
a voltage controlled oscillator (VCO) configured to generate a VCO clock of any frequency in response to a voltage control signal;
a divider configured to divide the VCO clock based on a dividing ratio to output a division clock;
a phase-frequency error detector configured to receive a reference clock and output a first error compensation signal based on the reference clock and the division clock;
a sampler configured to receive the reference clock and oversample the reference clock at a rising edge or a falling edge of the VCO clock to output a sampling clock;
a window phase error detector configured to receive the reference clock and output a second error compensation signal based on the reference clock and the sampling clock;
a residue phase error detector configured to output a third error compensation signal based on the VCO clock and the sampling clock;
an adder configured to accumulate the first error compensation signal, the second error compensation signal, and the third error compensation signal to output a final error compensation signal; and
a loop filter configured to convert and output the final error compensation signal into the voltage control signal.

2. The phase-locked loop circuit of claim 1, wherein the phase-frequency error detector detects a first phase difference between the reference clock and the division clock and outputs the first error compensation signal corresponding to the first phase difference, and
wherein the first error compensation signal is a current signal.

3. The phase-locked loop circuit of claim 2, wherein the current signal is non-linearly proportional in magnitude to the first phase difference.

4. The phase-locked loop circuit of claim 1, wherein the sampling clock includes edge information of the VCO clock and frequency information of the reference clock.

5. The phase-locked loop circuit of claim 1, wherein the sampler compares phases of the reference clock and the VCO clock and further outputs an early signal or a late signal depending on an order of the phases of the reference clock and the VCO clock.

6. The phase-locked loop circuit of claim 5, wherein the residue phase error detector considers the early signal or the late signal while detecting a phase difference between the VCO clock and the sampling clock.

7. The phase-locked loop circuit of claim 1, wherein the window phase error detector detects a second phase difference between the reference clock and the sampling clock and outputs the second error compensation signal corresponding to the second phase difference, and
wherein the second error compensation signal is a current signal.

8. The phase-locked loop circuit of claim 7, wherein the current signal is non-linearly proportional in magnitude to the second phase difference.

9. The phase-locked loop circuit of claim 1, further comprising:
a delay loop circuit,
wherein the delay loop circuit multiplies a reference frequency signal by N times via edge coupling to generate the reference clock.

10. The phase-locked loop circuit of claim 1, further comprising:
a modulator configured to accumulate a frequency command word to calculate a fractional division ratio,
wherein the divider divides the VCO clock at the fractional division ratio to output the division clock.

11. An operation method of a phase-locked loop circuit, the operation method comprising:
receiving a reference clock;
generating a voltage controlled oscillator (VCO) clock in response to a voltage control signal;
dividing the VCO clock based on a dividing ratio to output a division clock;
oversampling the reference clock at a rising edge or a falling edge of the VCO clock to output a sampling clock;
generating error compensation signals based on the reference clock, the VCO clock, the division clock, and the sampling clock;
generating the voltage control signal based on the error compensation signals; and
generating an output clock in response to the voltage control signal;
wherein the generating of the error compensation signals includes:
comparing first phase differences between the reference clock and the division clock to generate a first error compensation signal;
comparing second phase differences between the reference clock and the sampling clock to generate a second error compensation signal; and
comparing third phase differences between the sampling clock and the VCO clock to generate a third error compensation signal.

12. The operation method of claim 11, wherein the outputting of the division clock includes:
accumulating a frequency command word to calculate a fractional division ratio; and
dividing the VCO clock at the fractional division ratio.

13. The operation method of claim 11, wherein the sampling clock includes edge information of the VCO clock and frequency information of the reference clock.

14. The operation method of claim 1, wherein the generating of the third error compensation signal includes:

comparing phases of the reference clock and the VCO clock;
outputting an early signal or a late signal in an order of the phases of the reference clock and the VCO clock; and
generating the third error compensation signal with regard to the early signal or the late signal based on the third phase difference.

15. The operation method of claim 1, wherein the first error compensation signal, the second error compensation signal, and the third error compensation signal are current signals.

16. The operation method of claim 15, wherein a first current signal corresponding to the first error compensation signal is non-linearly proportional in magnitude to the first phase difference, and
wherein a second current signal corresponding to the second error compensation signal is non-linearly proportional in magnitude to the second phase difference.

17. The operation method of claim 15, wherein the generating of the voltage control signal includes:
adding the first error compensation signal, the second error compensation signal, and the third error compensation signal to generate a final error compensation signal;
converting the final error compensation signal into the voltage control signal; and
removing a high frequency component of the voltage control signal.

18. The operation method of claim 1, wherein the generating of the first error compensation signal is more activated when the first phase difference is greater than a reference value, and
wherein the generating of the second error compensation signal is more activated when the second phase difference is less than or equal to the reference value.

19. The operation method of claim 18, wherein the first phase difference is the same as the second phase difference or has a difference of a setting value or less.

* * * * *